United States Patent [19]

Steinlein

[11] 4,429,278

[45] Jan. 31, 1984

[54] MULTI-FUNCTION TIME DELAY RELAY

[75] Inventor: Hans-Wolfgang Steinlein, Hersbruck, Fed. Rep. of Germany

[73] Assignee: Siemens Aktiengesellschaft, Munich, Fed. Rep. of Germany

[21] Appl. No.: 299,637

[22] Filed: Sep. 4, 1981

[30] Foreign Application Priority Data

Sep. 15, 1980 [DE] Fed. Rep. of Germany ....... 3034734

[51] Int. Cl.[3] .................... H03K 17/28; H03K 17/296

[52] U.S. Cl. ................................ 328/129.1; 307/597; 307/598; 328/130.1

[58] Field of Search .............................. 307/597, 598; 328/129.1, 130.1

[56] References Cited

U.S. PATENT DOCUMENTS

| | | | |
|---|---|---|---|
| 3,826,955 | 7/1974 | Fest | 307/598 |
| 3,963,947 | 6/1976 | Bogel | 307/598 |
| 4,068,179 | 1/1978 | Sample | 328/130.1 |
| 4,134,027 | 1/1979 | Scott et al. | 328/129.1 |

*Primary Examiner*—John S. Heyman

*Attorney, Agent, or Firm*—Kenyon & Kenyon

[57] ABSTRACT

A multi-function time delay relay, with functions which can be changed from the outside, includes a timing oscillator and a logic network consisting of AND and OR stages and inverter stages as well as a flipflop interconnected in such a manner that two voltage inputs applied individually, separately or jointly, can bring about different modes of operation of the timing oscillator making it possible to realize different timing functions at any time and in any sequence, even during a running cycle, without having to intervene at the relay itself.

4 Claims, 14 Drawing Figures

MULTI-FUNCTION TIME DELAY RELAY

BACKGROUND OF THE INVENTION

The invention relates to a multi-function time delay relay with functions which can be changed from the outside.

In a known multi-function time delay relay of the above-mentioned kind, a series of terminals are provided at the housing of the relay which make it possible, by changing jumpers or by rewiring the control lines to other terminals, to change the relay to four different functions: delayed make, delayed break, self-wiping make and cycling. This means that changes must be made at the terminals before the relay is placed into operation (Multi-function Relay TRZEU of the firm Metzenauer & Jung, Catalog Sheet W 2934/79).

It is an object of the present invention to improve a multi-function time delay relay of the above-mentioned type in such a manner that it is possible to change the timing function in a simple manner from any point and at any time, i.e., even while the multi-function relay is running.

SUMMARY OF THE INVENTION

In a multi-function relay of the above-mentioned type this is achieved in a simple manner by implementing the delay function with an electronic timer which can be started, stopped and reset, preceded by a logic network with two inputs which, to obtain different modes of operation of the timer, can be supplied with voltage individually, separately and/or jointly at any desired point in time. It has been found to be advantageous if the timer is a programmable timing oscillator with a start (power-on) input, a output which changes the signal at the end of the cycle, a stop and resetting input as well as with an inverting input for the signal at the output.

Such programmable timers are commercially available, for instance, from the firm Motorola under the designation MC 14541B. Their operation is described in the data sheets for the programmable timer MC 14541B, pages 9-538 to 9-543 published by Motorola.

A particularly simple type of logic circuit for use with the timer is obtained by using a logic network which includes AND, OR and inverting stages and a flipflop. A simple design of the multi-function time delay relay with respect to circuitry is obtained if the voltage of the one input is applied to a first inverter, to the one input of each of two AND stages and the one input of a first OR stage. The voltage of the other input is fed to a second inverter stage, to the second input of the first AND stage and the first OR stage as well as to a first dynamic input of a flipflop. The output of the second inverter is connected to the second input of the second AND stage, the output of which is connected to the resetting input of the flipflop. The output of the first inverter is coupled to the first input of a third AND stage, the second input of which is connected to the second output of the flipflop. The output of the first AND stage is connected to the set input as well as to the second dynamic input of the flipflop and to the first input of a second OR stage, the output of which forms the control output of the time delay relay. The second input of the second OR stage is connected to the output of the programmable timing oscillator. The output of the third AND stage is connected to the inverting input of the programmable timing oscillator, the output of the first OR stage to the start input, and the first output of the flipflop to the stop and reset input of the programmable timing oscillator.

DETAILED DESCRIPTION

The heart of the time delay relay according to the present invention is the timer, in the illustrated embodiment, the programmable timer 1. It has a start-up (power-on) input which is designated as $U_B$ and is also called Autoreset (AR). It is coupled to the supply voltage of the module. The running cycle is thereby started at T=0 as soon as a positive signal is supplied to the start-up input $U_B$. The output Q of the oscillator changes its polarity at the end of the running cycle. The stop and reset input (MR), also called Master Reset, stops the cycle if a positive signal is present at this input. In addition, the counter is reset. The input designated $Q_S$ is an inverting input. During the running time, the output Q has, for instance, an L signal; after the end of the cycle is reached, the L signal changes to an H signal provided that a negative potential, i.e., L signal is present at the inverting input $Q_S$. The output polarity is inverted whenever an H signal is present at the inverting input $Q_S$. The network for addressing the programmable timing oscillator 1 consists, as shown in FIGS. 1 to 7, of two inverters $I_1$ and $I_2$, three AND stages $U_1$ to $U_3$, two OR stages $O_1$ and $O_2$, and a flipflop FF. The flipflop has a first dynamic input $C_1$ which reacts to an edge rising toward H; a second input $C_2$ which reacts to an edge falling toward L; two oppositely polarized outputs $Q_1$ and $Q_2$; a set input S and a reset input R. The line voltage terminals are designated as $A_1$ and $B_1$. The common other pole for the two voltages is designated as $A_2$. The electrical combination of the individual AND, OR and inverter stages, and the flipflop with the programmable timing oscillator with each other can be seen from FIGS. 1 to 7 without further explanation.

Figure 1:
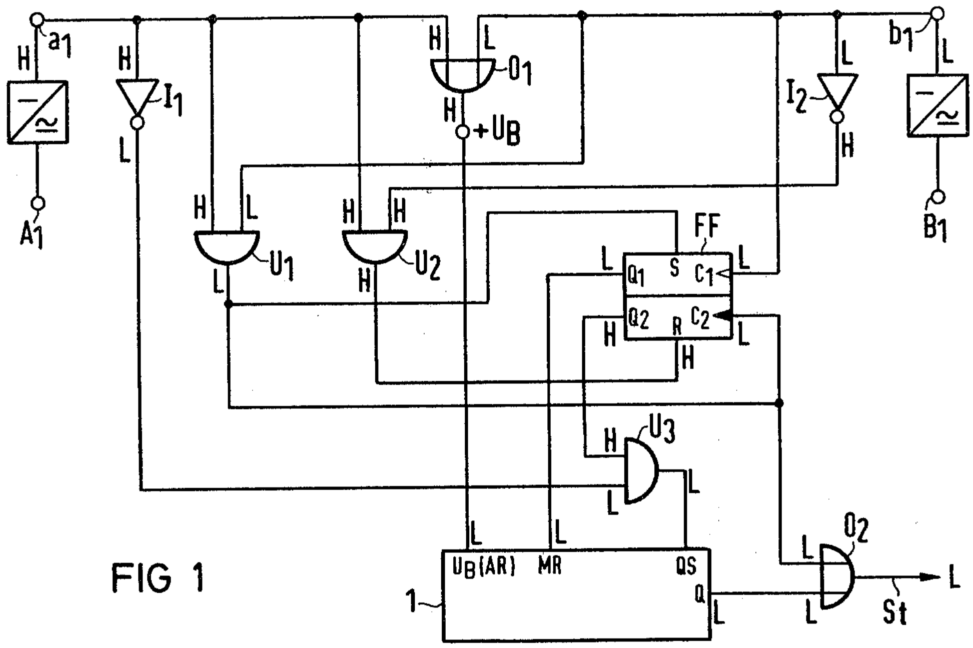
FIGS. 1 to 7 show different level diagrams corresponding to the expected function of the time delay relay.

The level diagrams of FIGS. 1–7 show the signals at individual points depending on the manner of operation. FIG. 1 shows the level plan for pick-up delay. Here, voltage is applied to $A_1$ during the running time. The output Q of the timer 1 and the control output St are inactive. However, an H signal is present at the start input $U_B$, so that the output signal changes when the end of the cycle is reached; the time delay relay switches with a delayed pickup as can be seen from the level plan of FIG. 2. There, voltage continues to be present at $A_1$, and an H signal at the output Q and at the control output St, so that the switching member of the time delay relay itself, not shown here, can be activated thereby.

Figure 3:
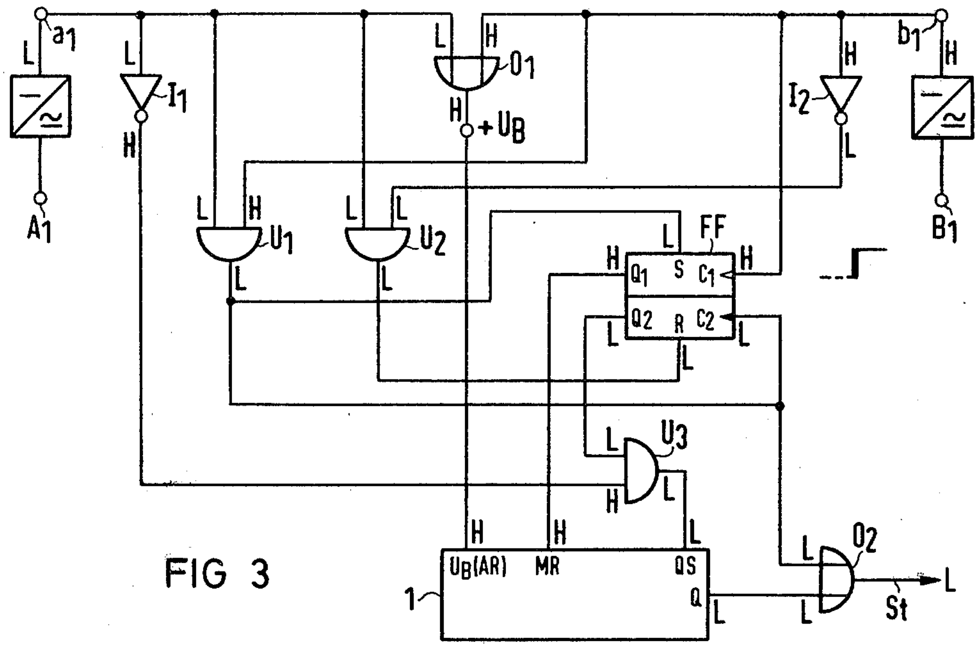

FIGS. 3 to 6 represent the drop back delay. In FIG. 3, voltage is applied to $B_1$. The output $Q_1$ of the flipflop FF is set by $C_1$ and blocks the timing oscillator via the stop and reset input MR. The control output St as well as the output Q of the timing oscillator 1 carry an L signal. If $A_1$ is not added on, see FIG. 4, the timing cycle, i.e., the output Q of the timing oscillator, remains blocked; the control output St becomes active via the AND gate $U_1$ and the OR gate $O_2^2$, i.e., the time delay relay is switched. This case would correspond to the so-called immediate switching mode during the function "drop-out delay." If the voltage is now removed again from $A_1$ and voltage remains at $B_1$, the outputs $Q_1$ and $Q_2$ of the flipflop FF are inverted by $C_2$. The stop and reset input MR releases the timing oscillator 1 and the timing cycle runs. The control output remains active via the AND gate $U_3$, the inverting input $Q_2$, the output Q of the timing oscillator and the OR stage 2, see FIG. 5. When the return time is reached, the output Q of the timing oscillator 1 goes to an L signal; the control output is thereby made inactive and the time delay relay is switched off. This can be seen from the levels in FIG. 5.

Simultaneous inversion of the inputs $A_1$ and $B_1$ would be an unintended control process which, however, can occur accidentally. $A_1$ changes from zero to the nominal voltage and $B_1$, from the nominal voltage to zero. This corresponds to the start of the response delay, as can be seen from FIG. 1.

If $A_1$ changes from the line voltage to zero and $B_1$ from zero to line voltage, the dynamic inputs $C_1$ and $C_2$ of the flipflop FF are addressed simultaneously by the proper edges. This case can be seen in FIG. 7. Depending on whether simultaneity is briefly interrupting or briefly overlapping, either the case "auxiliary voltage addition" according to FIG. 3 or the case "start drop-back delay" according to FIG. 5 will occur. In inverting, care must therefore be taken that an unambiguous pause or an unambiguous overlap is provided.

Figure 8:
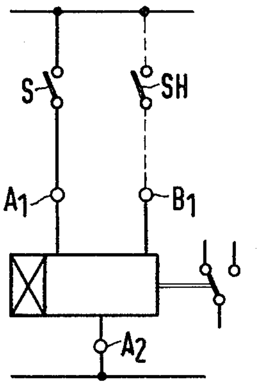
FIGS. 8 to 10 illustrate specific applications of the time delay relay according to the present invention without auxiliary contacts.
Figure 9:
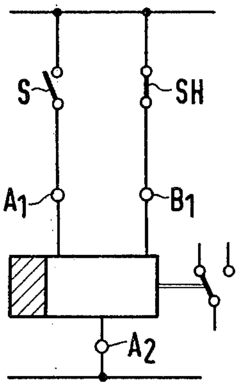

The specified pick-up delay or drop-back delay can be realized with a relay circuit as shown in FIGS. 8 and 9. In the case of pick-up delay, only the control contacts of FIG. 8 must be closed, i.e., the auxiliary switch SH can be omitted since voltage must be applied only to $A_1$. In the case of a drop-out delay as shown in FIG. 9, voltage is also continuously applied to $B_1$, i.e. the auxiliary switch SH is closed and the control contacts S merely connect $A_1$ to the line.

Figure 10:
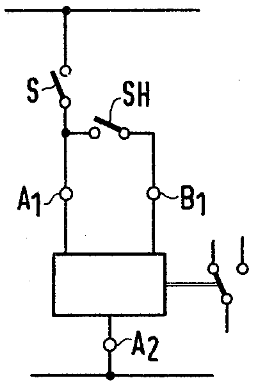

FIG. 10 shows a possible circuit for immediate switching or connecting through. As soon as voltage is applied to $A_1$ and $B_1$, simultaneously or in any sequence shifted in time, the output Q of the flipflop FF is set via the AND gate $U_1$, which blocks the timing oscillator. At the same time, the control output becomes active via $U_1$ and the OR gate $O_2$. The relay pulls up or remains pulled up, (see the level plan of FIG. 4). The following cases can be distinguished here: If voltage is applied simultaneously to $A_1$ and $B_1$, i.e., the switch SH of FIG. 10, is closed, and the control contact S is actuated later, the relay switch is switched immediately. If $B_1$ is switched on to $A_1$ after the end of the cycle, i.e., if SH is closed after S, the relay remains energized. If $B_1$ is added to $A_1$ during the running time, the running cycle is shortened. If on the other hand $A_1$ is added to $B_1$ after the return time (which is not possible with the circuit arrangement according to FIG. 10), the relay is switched on. If $A_1$ is switched on in addition to $B_1$ during the running time, the return time is broken off.

If $A_1$ and $B_1$ are without voltage, the relay drops off and the timing oscillator stops. Here also, the following possibilities can be distinguished again: No voltage at $B_1$ and after the end of the cycle, the voltage is removed from $A_1$, i.e., the relay drops off. $B_1$ again has no voltage and the voltage is removed from $A_1$ during the running time, i.e., the cycle is broken off. If however, $A_1$ has no voltage and the voltage is removed from $B_1$ after the return time, the relay remains dropped off. If $A_1$ has no voltage and the voltage is removed from $B_1$ during the return time, the return time is shortened.

It can be said in summary that, regardless in what state the relay operates, during the running time or after the end of the cycle, and independently of whether the relay operates with a response delay or with a delayed drop-out: if $A_1$ and $B_1$ are energized, the relay is switched on and the running cycle stops and, if $A_1$ and $B_1$ are de-energized, the relay is switched off and the running time is reset. As has been demonstrated, the timing function can be changed by appropriate addressing regardless of the function phase then running. Thereby, timing functions such as make or break wiping, blinking and pick-up and drop-out delay can be realized in addition to pick-up delay, drop-out delay and immediate switching.

Figure 4:
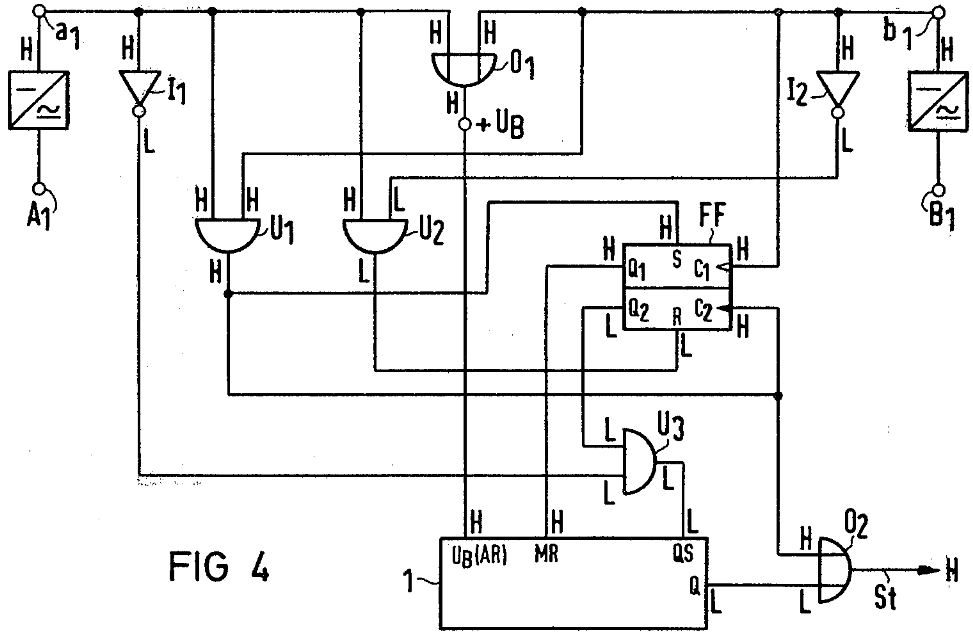
Figure 11:
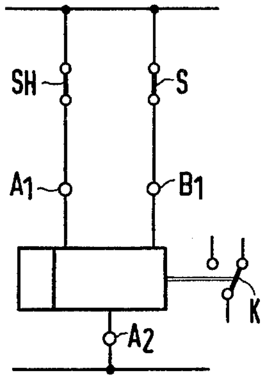
FIGS. 11 to 13 illustrate specific applications of the timing relay according to the present invention with auxiliary contacts.

Break wiping is shown by way of example in FIG. 11. The auxiliary switch SH is closed and the control contact S is connected in the circuit $B_1$, i.e., $A_1$ and $B_1$ carry voltage. The break contact of the relay is open, because the switching state according to FIG. 4 is present. If $B_1$ is de-energized, this corresponds to the level plan of FIG. 1, i.e., delayed pick-up; the relay drops off and pulls up again after the end of the cycle. The break contact acts like a break wiper.

Figure 12:
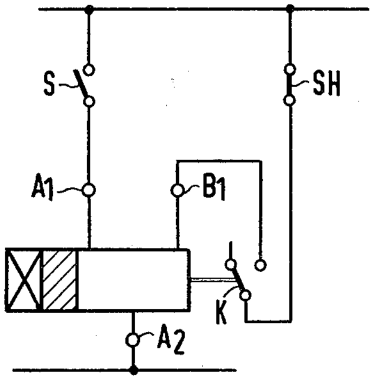
Figure 13:
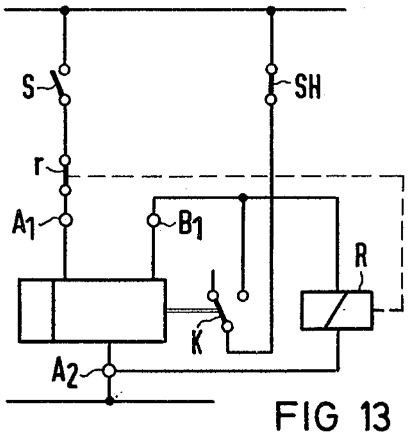

FIG. 12 shows pick-up and drop-back delay. If the make contact of the relay is used to connect the control input $B_1$ to the control voltage (this also can be accomplished via an auxiliary switch SH), the timing function "pick-up and drop-back delay" is obtained, as can be seen from the FIGS. 1, 4 and 5. The make contact is not without potential, however. By including an auxiliary relay R, the timing function "blinking" can be realized as indicated in FIG. 13. The operation is in principle similar to pick-up and drop-back delay except that the return time follows the running time immediately. The auxiliary contact r of the auxiliary relay R controls the blinking cycle automatically.

Figure 14:
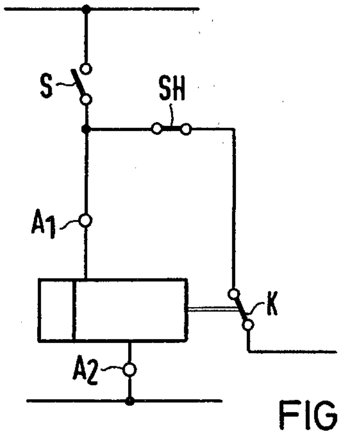
FIG. 14 shows a conventional application with auxiliary contacts and self-wiping make function.

FIG. 14 merely shows that the function "make wiping" can also be carried out with the relay according to the present invention without difficulties, as with conventional response delay relays.

The explanations above show that it is possible with the time delay relay according to the present invention to realize, merely by addressing two control inputs, the most important timing functions described above at any time and in any sequence, i.e., even during a running cycle and with remote control. It is possible with the time delay relay according to the present invention to automatically switch timing functions without causing illogical reactions. The timing functions are switched automatically at installations: normal (without auxiliary voltage) = pick-up delayed and with auxiliary voltage = drop-out delayed.

Additional adjusting means such as switches, plugs or terminals are unnecessary. The large number of attainable functions is listed in principle in the following function table. The arrow shown there next to the voltage U is to indicate either the addition or removal of the voltage. The central part of the table under "Comments" indicates which function phase is present, and under "level diagram" a reference is made to the corresponding figure, if shown.

Figure 2:
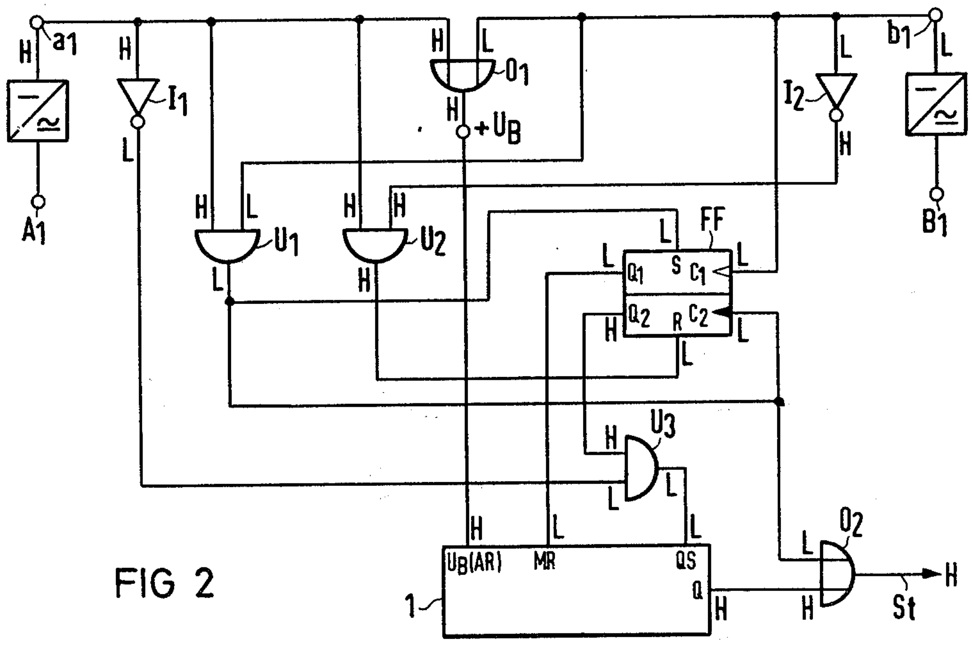
Figure 5:
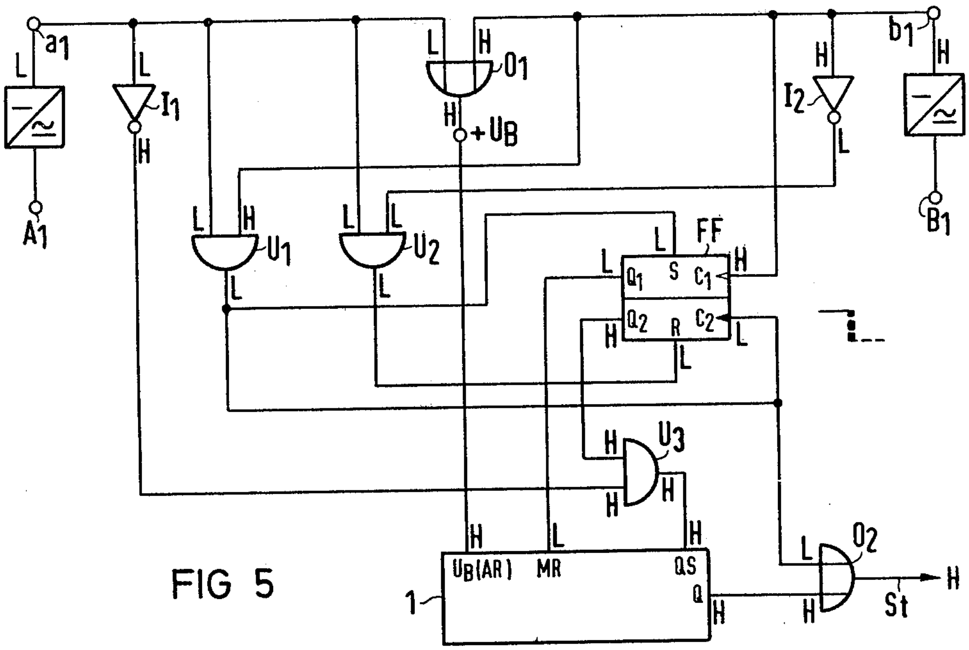
Figure 6:
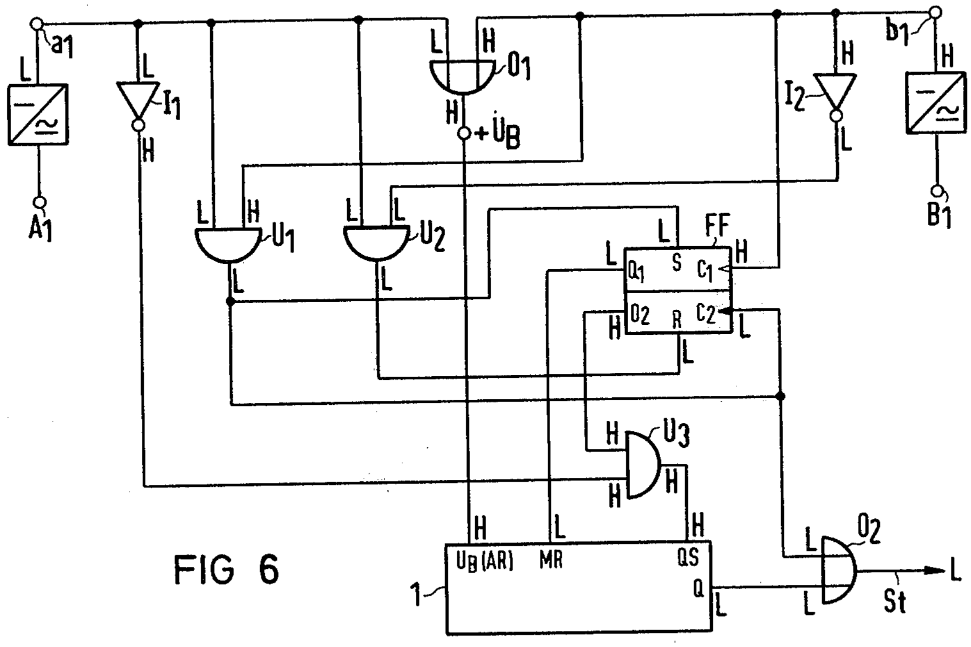
Figure 7:
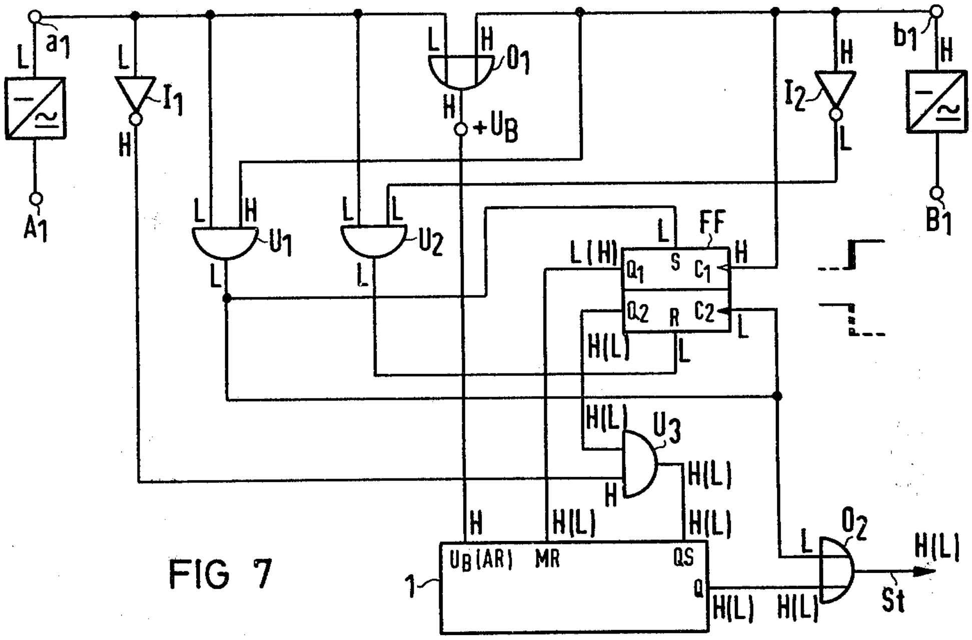

| | $A_1$ | $B_1$ | Comments | Level Diag. |
|---|---|---|---|---|
| Pickup | U↑ | O | Start, pick-up delay (AV) | FIG. 1 |
| Delay | U | O | during the running time (AV) | FIG. 1 |
| | U | O | after end of cycle | FIG. 2 |
| Drop-out | O | U↑ | Addition of auxiliary voltage | FIG. 3 |
| Delay | U↑ | U | Excitation of drop-back delay | FIG. 4 |
| | U↓ | U | Start drop-back delay | FIG. 5 |
| | O | U | during the running time (RV) | FIG. 5 |
| | O | U | after the return time | FIG. 6 |
| Immediate | U↑ | U↑ | Immediate switching | FIG. 4 |
| Switching | U | U↑ | after the end of cycle | FIG. 4 |
| | U | U↑ | during the running time (AV) | FIG. 4 |
| | U↑ | U | after the return time (Av) | FIG. 4 |
| | U↑ | U | during the running time (RV) | FIG. 4 |
| Immediate | U↓ | O | after end of cycle | -,- |
| Drop-out | U↓ | O | during the running time (AV) | -,- |
| | O | U↓ | after the return time | -,- |
| | O | U↓ | during the running time (RV) | -,- |
| Other | U | U↓ | Start, make wiping | FIG. 1 |
| | U↑ | U↓ | Start, pick-up delay | FIG. 1 |
| | U↓ | U↑ | indifferent, leads to addition | FIG. 7 |
| | | | of auxiliary voltage or start, | FIG. 3 |
| | | | drop-back delay. | FIG. 5 |

What is claimed is:

1. A multi-function time delay relay, the selected function of which can be changed from the outside, comprising:

(a) an electronic programmable timer having start, stop and reset inputs;

(b) a logic network with two inputs and having outputs coupled to said inputs of said timer; and (c) means for coupling one side of the line voltage individually, separately and/or jointly to said two inputs at any point in time to select different modes of operation of the programmable timer.

2. A multi-function time delay relay according to claim 1, wherein said programmable timer comprise a timing oscillator with a start-up input, an output which changes its state after the end of the cycle, a stop and reset input and an inverting input for the signal at said output.

3. A multi-function time delay relay according to claim 2, wherein said logic network includes AND, OR and inverter stages and a flipflop.

4. A multi-function time-lag relay according to claim 3, wherein said network comprises: a first inverting stage having one of said voltage inputs as its input; first and second AND stages having said one voltage input as a first input; a first OR stage having said one voltage input as a first input; a second inverter stage having said other voltage input as its input; said other voltage input also coupled to the second inputs of said first AND stage and said first OR stage; a flipflop having as one input said other voltage input; the output of said second inverter stage connected to the second input of said second AND stage, the output of said second AND stage connected to the reset input of said flipflop; a third AND stage having the output of the first inverter stage as a first input, the second input of said third AND stage connected to the second output of said flipflop; and the output of said first AND stage connected to the set input of said flipflop, and to the second input of said flipflop; a second OR stage, the first input of said second OR stage coupled to the output of said first AND stage, the output of said second OR stage constituting the control output of the time delay relay; and the second input of said second OR stage connected to the output of the timing oscillator, the output of said third AND stage connected to the inverting input of said timing oscillator, the output of the first OR stage connected to the start input, and the first output of the flipflop connected to the stop and reset input of the timing oscillator.

* * * * *